(12) United States Patent
Kuwano et al.

(10) Patent No.: US 10,797,643 B2
(45) Date of Patent: Oct. 6, 2020

(54) OSCILLATION CIRCUIT, MICROCOMPUTER AND ELECTRONIC DEVICE

(71) Applicant: SEIKO EPSON CORPORATION, Tokyo (JP)

(72) Inventors: Toshikazu Kuwano, Fujimi-machi (JP); Takahiro Kikuchi, Kai (JP); Sachiyuki Abe, Hara-mura (JP); Shuji Kawaguchi, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/232,122

(22) Filed: Dec. 26, 2018

(65) Prior Publication Data

US 2019/0199287 A1 Jun. 27, 2019

(30) Foreign Application Priority Data

Dec. 27, 2017 (JP) ................. 2017-250702

(51) Int. Cl.
*H03L 1/04* (2006.01)
*H03B 5/04* (2006.01)
(Continued)

(52) U.S. Cl.
CPC ............ *H03B 5/04* (2013.01); *H03B 5/1206* (2013.01); *H03K 3/011* (2013.01); *H03K 3/0231* (2013.01);
(Continued)

(58) Field of Classification Search
CPC ............ H03B 5/04; H03B 5/1206; H03B 2200/0038; H03B 2200/0088; H03K 3/011; H03K 3/0231
(Continued)

(56) References Cited

U.S. PATENT DOCUMENTS 5,384,553 A 1/1995 Takeda et al.
9,503,058 B1 * 11/2016 Cical ..................... H03L 7/00
(Continued)

FOREIGN PATENT DOCUMENTS

JP 2002-057576 A 2/2002
JP 2007-288419 A 11/2007
(Continued)

*Primary Examiner* — Richard Tan
(74) *Attorney, Agent, or Firm* — Oliff PLC (57) ABSTRACT

An oscillation circuit has a charge-discharge type oscillation unit that performs an oscillation operation at an oscillating frequency that is in accordance with a control current value, and a control current generation unit that generates the control current. The control current generation unit includes a reference voltage generation circuit that generates a reference voltage that has a first temperature characteristic, a temperature characteristic slope correction circuit that corrects a slope of a temperature characteristic of a reference voltage in accordance with first correction information and generates an output voltage that has a second temperature characteristic, and a voltage-current conversion circuit that converts the output voltage of the temperature characteristic slope correction circuit into the control voltage, and that corrects the control current value in accordance with second correction information.

16 Claims, 5 Drawing Sheets

(51) Int. Cl.
*H03B 5/12* (2006.01)
*H03K 3/0231* (2006.01)
*H03K 3/011* (2006.01)

(52) U.S. Cl.
CPC ............... *H03B 2200/0038* (2013.01); *H03B 2200/0088* (2013.01)

(58) Field of Classification Search
USPC .................................. 331/70, 111, 143, 176
See application file for complete search history.

(56) References Cited

U.S. PATENT DOCUMENTS

| | | | | |
|---|---|---|---|---|
| 2007/0290731 | A1* | 12/2007 | MacDonald | ............. G06F 1/22 327/198 |
| 2009/0051454 | A1* | 2/2009 | Yamamoto | ...... H01L 21/823493 331/177 R |
| 2011/0316515 | A1 | 12/2011 | Mitsuda et al. | |
| 2012/0074986 | A1 | 3/2012 | Nakamura et al. | |
| 2012/0161868 | A1 | 6/2012 | Yayama et al. | |
| 2012/0319793 | A1* | 12/2012 | Iwasa | .................... H03K 3/011 331/176 |
| 2013/0214869 | A1 | 8/2013 | Matsuzaki et al. | |
| 2013/0293313 | A1 | 11/2013 | Mitsuda et al. | |

FOREIGN PATENT DOCUMENTS

| | | |
|---|---|---|
| JP | 2012-010262 A | 1/2012 |
| JP | 2012-070224 A | 4/2012 |
| JP | 2012-138870 A | 7/2012 |
| JP | 2013-005109 A | 1/2013 |
| JP | 2013-172397 A | 9/2013 |

\* cited by examiner

OSCILLATION CIRCUIT, MICROCOMPUTER AND ELECTRONIC DEVICE

CROSS REFERENCE

This application claims benefit of Japanese Application JP 2017-250702, filed on Dec. 27, 2017. The disclosure of the prior application is hereby incorporated by reference herein in its entirety.

BACKGROUND

1. Technical Field

The present invention relates to an oscillation circuit in which the oscillating frequency is temperature compensated. Furthermore, the invention relates to a microcomputer, an electronic device, and the like that use such an oscillation circuit.

2. Related Art

A semiconductor apparatus such as a microcomputer has an oscillation circuit that supplies a clock signal to a CPU (central processing unit), a peripheral circuit, and the like. Generally, the oscillating frequency of an oscillation circuit has temperature dependence, and thus the oscillating frequency of the oscillation circuit is temperature compensated according to detected temperature information, by a temperature sensor detecting the environmental temperature.

As a related technology, JP-A-2012-70224 discloses a semiconductor apparatus that has a clock oscillation circuit in which the oscillating frequency is temperature compensated. This clock oscillation circuit has a current output circuit that can adjust the dependence of an output current on a power source voltage and temperature, a frequency voltage conversion circuit in which the frequency of the clock signal is changed by changing the number of electrostatic capacitance elements that are connected in parallel to a capacity node that receives output current, and a clock setting unit that generates and outputs a signal for setting the frequency of the clock signal to a frequency voltage conversion circuit. For example, the frequency is switched by a switch selecting an electrostatic capacitance element, based on a 4-bit frequency adjustment control signal.

JP-A-2012-70224 is an example of related art (Abstract, Paragraph 0030, FIG. 12).

In recent years, because temperature information can be obtained as digital values, control signals that control the oscillating frequency of an oscillation circuit are also digital signals, and a capacitance element or a resistance element used in an oscillation operation is switched by the control signal. Accordingly, when the oscillating frequency of an oscillation circuit is temperature compensated following a change in temperature, the oscillating frequency changes in discrete values rather than continuous values. As a result, it is possible that noise, jitter, and the like will increase due to changes in characteristics before and after the capacitance element or the resistance element is switched.

SUMMARY

An advantage of some aspects of the invention is to provide an oscillation circuit that continuously temperature compensates the oscillating frequency following a change in temperature to decrease noise, jitter, and the like, without switching a capacitance element or a resistance element used in an oscillation operation. A further advantage of some aspects of the invention is to provide a microcomputer and an electronic device that use such an oscillation circuit.

In order to solve at least one of the above problems, an oscillation circuit according to a first aspect of the invention includes a charge-discharge type oscillation unit that performs an oscillation operation at an oscillating frequency that is associated with a control current value, and a control current generation unit that generates the control current. The control current generation unit includes a reference voltage generation circuit that generates a reference voltage that has a first temperature characteristic, a temperature characteristic slope correction circuit that corrects a slope of a temperature characteristic of the reference voltage in accordance with the first correction information and generates an output voltage that has a second temperature characteristic, and a voltage-current conversion circuit that converts the output voltage of the temperature characteristic slope correction circuit into the control current, and that corrects the control current value in accordance with second correction information. The temperature dependence of the oscillating frequency of the charge-discharge type oscillation unit is suppressed by a temperature characteristic of the control current.

According to the first aspect of the invention, an oscillation circuit can be provided that, by the temperature characteristic slope correction circuit correcting the slope of the temperature characteristic of the reference voltage, and the voltage-current conversion circuit converting the output voltage of the temperature characteristic slope correction circuit into the control current of an appropriate magnitude and controlling the oscillating frequency, continuously temperature compensates the oscillating frequency following a change in temperature and lowers noise, jitter, and the like without switching the capacitance element or the resistance element that is used in an oscillation operation. Also, reduction of manufacturing costs and other such effects are possible because the circuit size is smaller than the existing oscillation circuit disclosed in JP-A-2012-70224.

Here, a configuration may be adopted in which the reference voltage generation circuit includes a bipolar transistor having a base that is connected to a collector, and generates the reference voltage based on a voltage between an emitter of the bipolar transistor and the base and collector. Through this, a temperature sensor is configured with a bipolar transistor, and can thus generate a reference voltage that has the first temperature characteristic.

Also, a configuration may be adopted in which the temperature characteristic slope correction circuit has a constant voltage generation circuit that generates a constant voltage, a differential amplifier circuit that amplifies the reference voltage with the constant voltage as the reference, and a first resistor that has a resistance value that is set in accordance with the first correction information and sets an amplification factor of the differential amplifier circuit, and the temperature characteristic slope correction circuit corrects the slope of the temperature characteristic of the reference voltage based on a resistance value of the first resistor. Thus, it is possible to correct the slope of the temperature characteristic of the reference voltage to a desired slope.

In such a case, the oscillation circuit may be configured such that the reference voltage and the constant voltage become equal at a predetermined temperature. Thus, it is possible to change the slope of the temperature characteristic of the output voltage of the differential amplifier circuit without changing the output voltage of the differential amplifier circuit at the predetermined temperature.

Furthermore, a configuration may be adopted in which the voltage-current conversion circuit has a first transistor and a second transistor that constitute a current mirror circuit, a third transistor that supplies current to the first transistor in accordance with the output voltage of the temperature characteristic slope correction circuit, and includes a second resistor that has a resistance value set in accordance with second correction information, and sets a voltage-current conversion rate of the third transistor, and corrects the control current value that is output from the second transistor based on the resistance value of the second resistor.

In that case, the third transistor may be formed using a triple well structure, and may have a back gate and a source connected to one end of a second resistor that is connected at another end to wiring that has a predetermined potential. In this way, by the back gate of the third transistor being connected to the source, it is possible to reduce the influence of the potential of the back gate on the characteristic of the third transistor and improve the accuracy of voltage-current conversion operation.

A microcomputer according to a second aspect of the invention has any of the oscillation circuits mentioned above, and a storage unit that stores the first and second correction information and supplies the information to the oscillation circuit. The storage unit may include a non-volatile memory or a plurality of fuses. According to the second aspect of the invention, it is possible to improve the accuracy of the characteristic of each oscillation circuit by saving the first and second correction information corresponding to each oscillation circuit to the storage unit.

An electronic device according to a third aspect of the invention has any of the oscillation circuits mentioned above. According to the third aspect of the invention, it is possible to provide an electronic device that operates in synchronization with an accurate clock signal that is generated by an oscillation circuit that continuously temperature compensates the oscillating frequency following a change in temperature to reduce noise, jitter, and the like.

DESCRIPTION OF EXEMPLARY EMBODIMENTS

The following is a detailed description of an embodiment of the invention with reference to the drawings. Note that the same constituent elements are given the same reference numerals and redundant descriptions are omitted.

Microcomputer.

Figure 1:
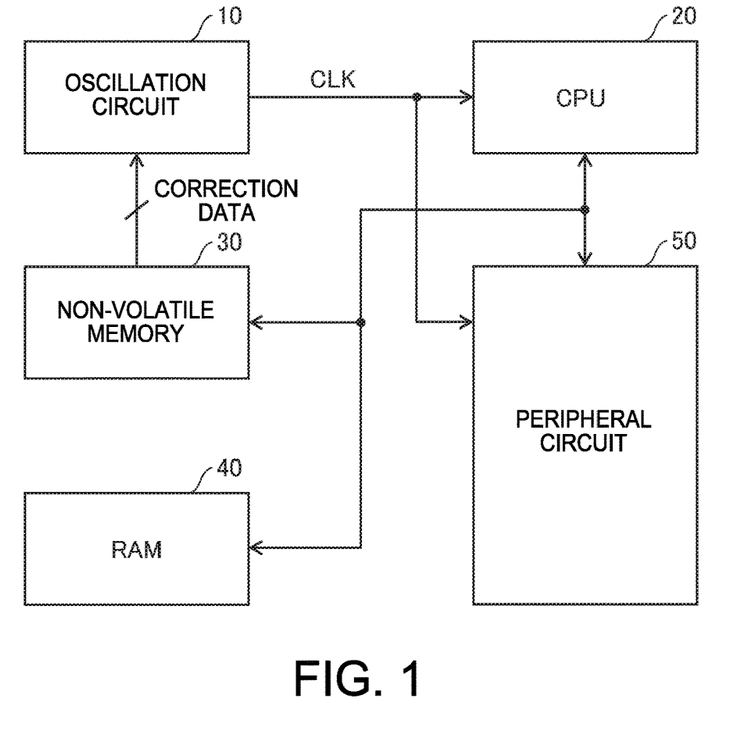
FIG. 1 is a block diagram showing a microcomputer according to an embodiment of the invention.

FIG. 1 is a block diagram showing an example of the microcomputer according to an embodiment of the invention. As shown in FIG. 1, this microcomputer includes an oscillation circuit 10 according to an embodiment of the invention, a CPU 20, a non-volatile memory 30, a RAM (random access memory) 40 and a peripheral circuit 50.

The oscillation circuit 10 generates a clock signal CLK that has a predetermined frequency by performing an oscillation operation and supplies the clock signal CLK to the CPU 20 and the peripheral circuit 50. The CPU 20 operates in synchronization with the clock signal CLK that is supplied from the oscillation circuit 10 and performs various types of signal processing and control processing in accordance with programs. The non-volatile memory 30 stores programs, data, and the like for the CPU 20 to perform various types of signal processing and control processing.

Also, the non-volatile memory 30 stores correction data (16-bit data, for example) that includes first correction information and second correction information that are used for correcting the oscillating frequency of the oscillation circuit 10 and supplies the correction data to the oscillation circuit 10. Note that, in order to store the correction data, a plurality of fuses may be provided separately from the non-volatile memory 30. The RAM 40 is used as a work area of the CPU 20, and temporarily stores programs and data read out from the non-volatile memory 30 or the results of calculations executed by the CPU 20 in accordance with programs, and the like.

Oscillation Circuit.

Figure 2:
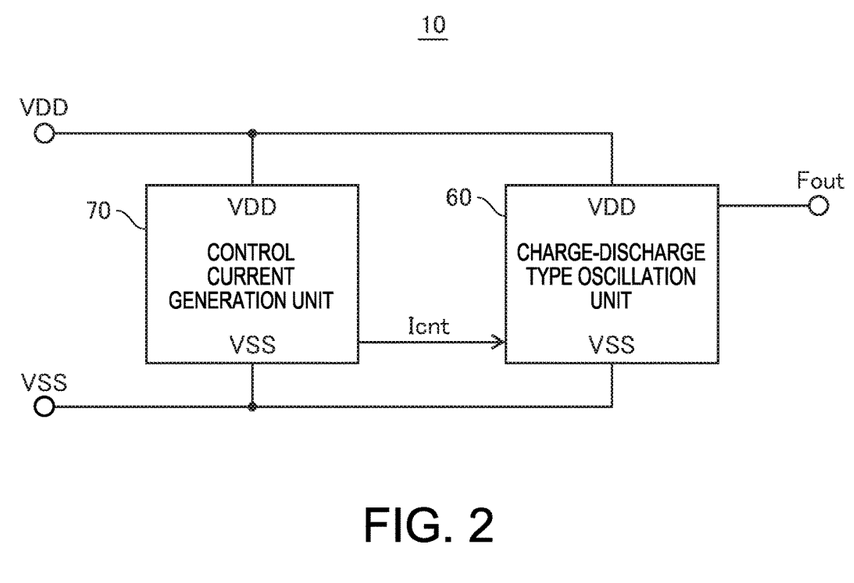
FIG. 2 is a circuit diagram showing an example of a configuration of an oscillation circuit shown in FIG. 1.

FIG. 2 is a circuit diagram showing an example of a configuration of the oscillation circuit shown in FIG. 1. As shown in FIG. 2, the oscillation circuit 10 includes a charge-discharge type oscillation unit 60 and a control current generation unit 70, and operates by being supplied a power source potential VDD of a high potential side and a power source potential VSS of a low potential side (ground potential 0V in the present embodiment). The charge-discharge type oscillation unit 60, by performing an oscillation operation at an oscillating frequency that is in accordance with the magnitude of a control current Icnt and generates an oscillation signal Fout. The control current generation unit 70 generates the control current Icnt for controlling the oscillating frequency of the charge-discharge type oscillation unit 60.

Charge-Discharge Type Oscillation Unit

Figure 3:
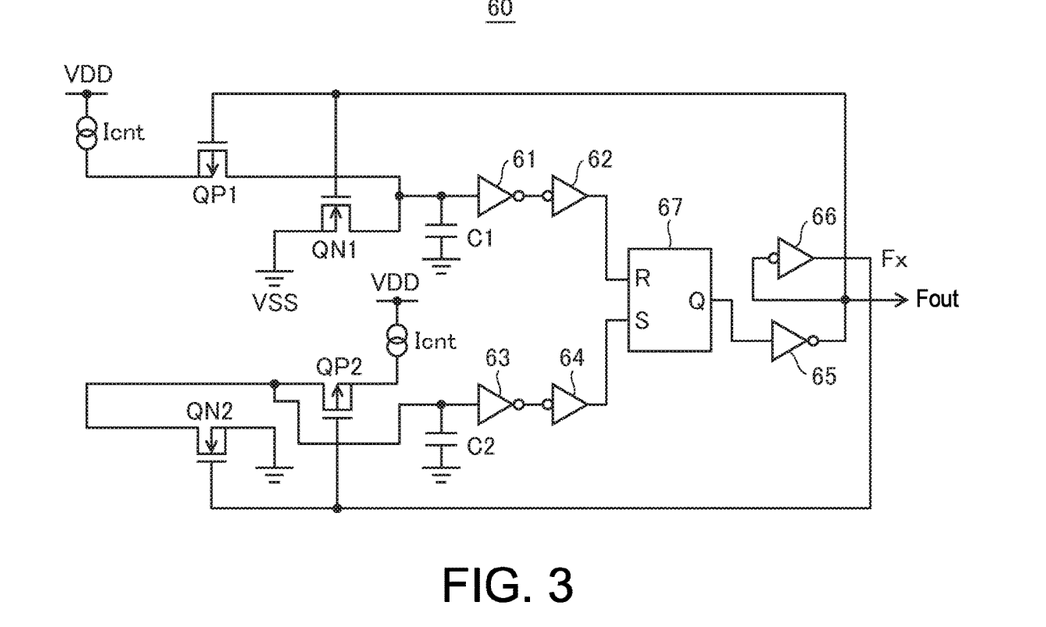
FIG. 3 is a diagram circuit showing an example of a configuration of a charge-discharge type oscillation unit shown in FIG. 2.

FIG. 3 is a diagram circuit showing an example of a configuration of the charge-discharge type oscillation unit shown in FIG. 2. As show in FIG. 3, the charge-discharge type oscillation unit 60 includes P-channel MOS transistors QP1 and QP2, N-channel MOS transistors QN1 and QN2, capacitors C1 and C2, inverters 61 to 66 and an RS flip-flop 67. The inverter 65 inverts the output signal that is output from an output terminal Q of the RS flip-flop 67 and generates the oscillation signal Fout, and the inverter 66 further inverts the oscillation signal Fout and generates an inverted oscillation signal Fx.

The control current Icnt that is supplied to the charge-discharge type oscillation unit 60 is supplied to the source of a transistor QP1 and the source of a transistor QP2 by the current mirror circuit and the like. The transistor QP1 has a gate to which the oscillation signal Fout is applied. The transistor QN1 has a drain that is connected to a drain of the transistor QP1, a source that is connected to wiring of the power source potential VSS, and a gate to which the oscillation signal Fout is applied.

The capacitor C1 has one end that is connected to the drain of the transistor QP1 and the drain of the transistor QN1, and another end that is connected to wiring of the power source potential VSS. The signal that occurs at the one end of the capacitor C1 is buffered by the inverters 61 and 62 and is supplied to a reset terminal R of the RS flip-flop 67 as a reset signal.

The transistor QP2 has a gate to which the inverted oscillation signal Fx is applied. The transistor QN2 has a drain that is connected to the drain of the transistor QP2, a source that is connected to wiring of the power source potential VSS, and a gate to which the inverted oscillation signal Fx is applied.

A capacitor C2 has once end that is connected to the drain of the transistor QP2 and the drain of the transistor QN2, and another end that is connected to wiring of the power source potential VSS. The signal that occurs at the one end of the capacitor C2 is buffered by the inverters 63 and 64 and is supplied to a set terminal S of the RS flip-flop 67 as a set signal.

The RS flip-flop 67 is set in synchronization with the rising edge of the set signal, and activates the output signal to high level when the reset signal is at low level, and is set in synchronization with the rising edge of the reset signal, and deactivates the output signal to low level when the set signal is at low level.

When the RS flip-flop 67 is reset, the oscillation signal Fout becomes high level and the inverted oscillation signal Fx becomes low level. Accordingly, the transistor QP1 will be in an OFF state and the transistor QN1 will be in an ON state, and thus the charge that is charged in the capacitor C1 is discharged and the reset signal becomes low level.

On the other hand, the transistor QP2 will be in an ON state and the transistor QN2 will be in an OFF state, and thus the control current Icnt flows to the capacitor C2 and charges the capacitor C2, and the set signal becomes high level. Through this, the RS flip-flop 67 is set and the output signal is activated to high level.

When the RS flip-flop 67 is set, the oscillation signal Fout becomes low level and the inverted oscillation signal Fx becomes high level. Accordingly, the transistor QP2 will be in an OFF state and the transistor QN2 will be in an ON state, and thus the charge that is charged in the capacitor C2 is discharged and the set signal becomes low level.

On the other hand, the transistor QN1 is in its OFF state when the transistor QP1 is in its ON state, and thus the control current Icnt flows to the capacitor C1 and charges the capacitor C1, and the set signal becomes high level. Through this, the RS flip-flop 67 is reset and the output signal is deactivated to low level.

In this way, the charge-discharge type oscillation unit 60 performs a highly accurate oscillation operation by the RS flip-flop 67 repeatedly setting and resetting. The rate at which the RS flip-flop 67 repeats the setting and resetting is substantially proportionate to the control current value Icnt, and as such it is possible to control the oscillating frequency of the charge-discharge type oscillation unit 60 by the control current value Icnt.

The Control Current Generation Unit.

Figure 4:
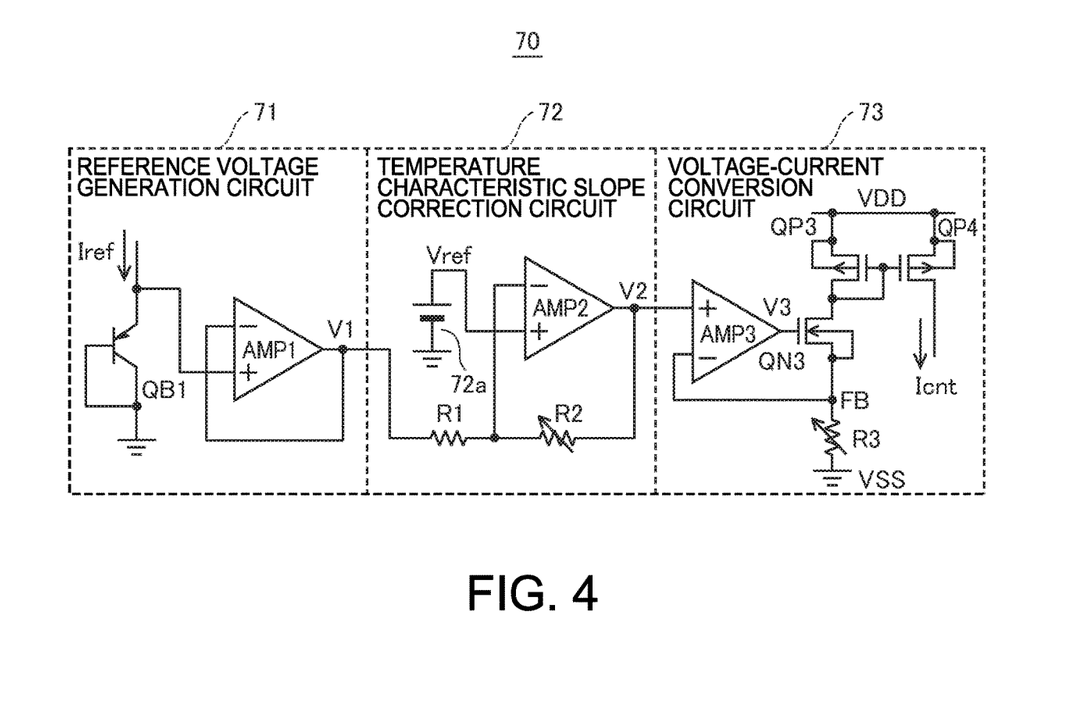
FIG. 4 is a circuit diagram showing an example of a configuration of a control current generation unit shown in FIG. 2.

FIG. 4 is a circuit diagram showing an example of a configuration of the control current generation unit shown in FIG. 2. As shown in FIG. 4, the control current generation unit 70 includes a reference voltage generation circuit 71, a temperature characteristic slope correction circuit 72, and a voltage-current conversion circuit 73.

Reference Voltage Generation Circuit.

The reference voltage generation circuit 71, for example, includes a PNP bipolar transistor QB1 and a differential amplifier circuit AMP1, and generates a reference voltage V1 that has a first temperature characteristic. The transistor QB1 has an emitter to which a constant current Iref is supplied, and has a collector and a base that are connected to wiring of the power source potential VSS. The base of the transistor QB1 is connected to the collector, and as such the transistor QB1 is equivalent to a diode.

The differential amplifier circuit AMP1 has a non-inverting input terminal that is connected to an emitter of the transistor QB1 and an inverting input terminal that is connected to the output terminal, and operates as a voltage follower that buffers the voltage that is applied to the non-inverting input terminal and outputs the voltage from the output terminal. Accordingly, the reference voltage generation circuit 71 generates the reference voltage V1 based on the voltage between the emitter of the transistor QB1 and the base and collector. Through this, a temperature sensor is configured with a bipolar transistor, and can generate a reference voltage V1 that has the first temperature characteristic.

Figure 5:
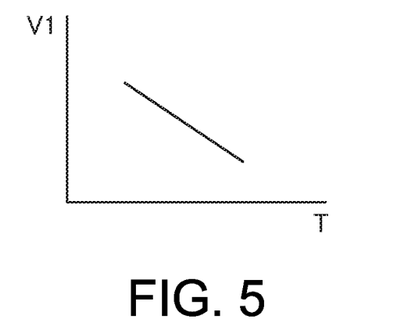
FIG. 5 is a diagram showing a temperature characteristic of a reference voltage that is generated by the reference voltage generation circuit.

FIG. 5 is a diagram schematically showing the temperature characteristic of the reference voltage that is generated by the reference voltage generation circuit shown in FIG. 4. In FIG. 5, the horizontal axis shows a temperature T and the vertical axis shows the reference voltage V1 that is generated by the reference voltage generation circuit 71. In the example shown in FIG. 5, the reference voltage V1 falls following the rising of the temperature T.

If the constant current Iref has an extremely low temperature dependence, the temperature characteristic of the reference voltage V1 is determined mainly by the temperature characteristic of the transistor QB1, but because the temperature dependence of the control current Icnt that is ultimately output from the control current generation unit 70 can be adjusted, the temperature dependence of the constant current Iref is permissible within a predetermined range.

Temperature Characteristic Slope Correction Circuit.

The temperature characteristic slope correction circuit 72 includes, for example, a constant voltage generation circuit 72a, a differential amplifier circuit AMP2, and resistors R1 and R2, and corrects the slope of the temperature characteristic of the reference voltage V1 in accordance with the first correction information (6-bit data, for example) that is included in the correction data shown in FIG. 1, and generates an output voltage V2 that has the second temperature characteristic.

The constant voltage generation circuit 72a is constituted by, for example, a band-gap reference circuit and the like, and generates a constant voltage Vref. The constant voltage Vref desirably has an extremely low temperature dependence, but because the temperature dependence of the control current Icnt ultimately output from the control current generation unit 70 can be adjusted, the temperature dependence of the constant voltage Vref is permissible within a predetermined range.

The differential amplifier circuit AMP2 has a non-inverting input terminal to which the constant voltage Vref is applied, an inverting input terminal that is connected to the output terminal of the reference voltage generation circuit 71 via the resistor R1 and to the output terminal of the differential amplifier circuit AMP2 via the resistor R2, and outputs the output voltage V2 from the output terminal by amplifying the reference voltage on the basis of the constant voltage Vref.

Here, at least one of the resistors R1 and R2 (resistor R2 in FIG. 4) is a variable resistor (also called the "first resistor") that has a resistance value set in accordance with the first correction information, and that sets the amplification factor (closed loop gain) of the differential amplifier circuit AMP2. The temperature characteristic slope correction circuit 72 corrects the slope of the temperature characteristic of the reference voltage V1 based on the resistance value of the first resistor. Thus, it is possible to correct the slope of the temperature characteristic of the reference voltage V1 to a desired slope.

The output voltage V2 of the differential amplifier circuit AMP2 is obtained as follows, assuming that the open loop gain of the differential amplifier circuit AMP2 is sufficiently large:

$$V2-Vref=-(R2/R1)(V1-Vref)$$

$$\therefore V2=Vref-(R1/R1)(V1-Vref) \quad (1)$$

Figure 6:
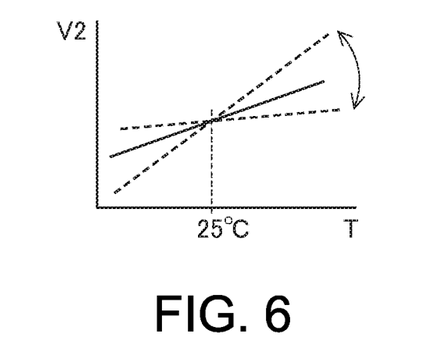
FIG. 6 is a diagram showing a temperature characteristic of an output voltage of the temperature characteristic slope correction circuit.

FIG. 6 is a diagram schematically showing the temperature characteristic of the output voltage of the temperature characteristic slope correction circuit shown in FIG. 4. In FIG. 6, the horizontal axis shows the temperature T and the vertical axis shows the output voltage V2 of the temperature characteristic slope correction circuit 72. In the example shown in FIG. 6, the output voltage V2 rises following the rise of the temperature T.

From the formula (1), it is possible to change the slope of the temperature characteristic of the output voltage V2 of the differential amplifier circuit AMP2 without changing the output voltage V2 of the differential amplifier circuit AMP2 at a predetermined temperature by configuring the oscillation circuit such that the reference voltage V1 and the constant voltage Vref become equal at a predetermined temperature (25° C., for example).

The Voltage-Current Conversion Circuit.

The voltage-current conversion circuit 73 includes, for example, a differential amplifier circuit AMP3, P-channel MOS transistors QP3 and QP4, an N-channel MOS transistor QN3, and a resistor R3, and converts the output voltage V2 of the temperature characteristic slope correction circuit 72 to the control current Icnt, and corrects the control current value Icnt in accordance with the second correction information (10-bit data, for example) that is included in the correction data shown in FIG. 1.

The differential amplifier circuit AMP3 has a non-inverting input terminal to which the output voltage V2 of the temperature characteristic slope correction circuit 72 is applied, and an inverting input terminal to which a feedback voltage FB is applied, and outputs an output voltage V3 from the output terminal. A transistor QN3 has a gate to which the output voltage V3 of the differential amplifier circuit AMP3 is applied, and a source that is connected to wiring of the power source potential VSS via the resistor R3.

The transistors QP3 and QP4 are a first transistor and a second transistor that constitute the current mirror circuit. The transistor QN3 has a source that is connected to wiring of the power source potential VDD and a drain and a gate that are connected to the drain of the transistor QN3.

The transistor QP4 has a source that is connected to wiring of the power source potential VDD and a gate that is connected to a drain and a gate of the transistor QP3. A current that is proportional to the current that flows to the transistor QP3 flows to the transistor QP4 and the control current Icnt is generated.

The transistor QN3 is a third transistor that supplies current to the transistor QP3 in accordance with the output voltage V2 of the temperature characteristic slope correction circuit 72. The feedback voltage FB is generated at one end of the resistor R3 when current flows to the transistor QN3. The feedback voltage FB is applied to the inverting input terminal of the differential amplifier circuit AMP3, and as such becomes substantially equal to the output voltage V2 of the temperature characteristic slope correction circuit 72 that is applied to the non-inverting input terminal.

Accordingly, the control current Icnt is expressed in the following formula (2), using a current I3 that flows to the transistor QN3 and:

$$Icnt=\alpha I3=\alpha V2/R3 \quad (2)$$

Here, α is a constant of proportionality that is determined by the ratio of the magnitude of the transistors QP3 and QP4 that constitute the current mirror circuit.

Also, the resistor R3 a variable resistor (also called the "second resistor") that has a resistance value set in accordance with the second correction information, and that sets the voltage-current conversion rate of the transistor QN3. The voltage-current conversion circuit 73 corrects the control current value Icnt that is output from the transistor QP4 based on the resistance value of the second resistor. Thus, it is possible to set the oscillating frequency at a predetermined temperature to a desired frequency.

Figure 7:
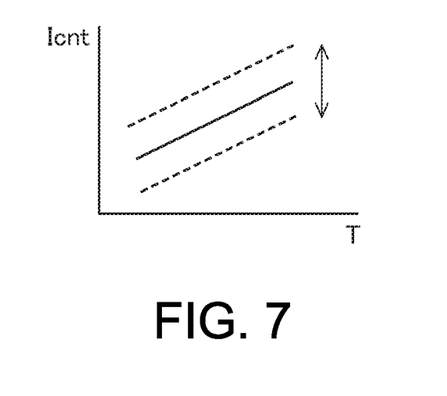
FIG. 7 is a diagram showing a temperature characteristic of a control current that is generated a the voltage-current conversion circuit.

FIG. 7 is a diagram schematically showing the temperature characteristic of the control current that is generated by the voltage-current conversion circuit shown in FIG. 4. In FIG. 7, the horizontal axis shows a temperature T and the vertical axis shows the control current Icnt that is generated by the voltage-current conversion circuit 73. In the example shown in FIG. 7, the control current Icnt rises following the rise of the temperature T.

Oscillating Frequency Adjustment.

When referring to FIG. 4 to FIG. 7, in order to adjust the oscillating frequency of an oscillation circuit, first, the resistance value of the resistor R3 in the voltage-current conversion circuit 73 is adjusted and the control current value Icnt is adjusted (see FIG. 7) such that the oscillating frequency at a predetermined temperature (25° C., for example) matches a target value. Next, the resistance value of the resistor R2 (or R1) in the temperature characteristic slope correction circuit 72 is adjusted and the temperature characteristic of the output voltage V2 is adjusted (see FIG. 6) such that the frequency error becomes lower at a high temperature (85° C., for example) or in a low temperature.

When these resistance values are determined, setting information for setting the resistance value is stored as correction data in the non-volatile memory 30 shown in FIG. 1 (or a fuse), and is automatically read out and used when the oscillation circuit 10 is started. In this way, it is possible to improve the characteristic of each oscillation circuit by saving correction data (the first and second correction information) that corresponds to each oscillation circuit in the storage unit.

Figure 8:
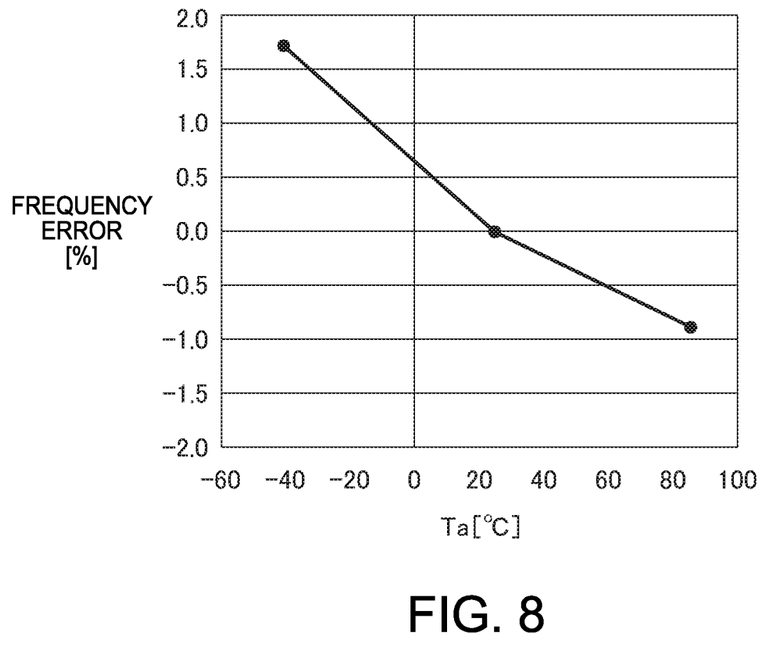
FIG. 8 is a diagram showing a frequency error in a state in which the temperature characteristic of the oscillation circuit has not been corrected.
Figure 9:
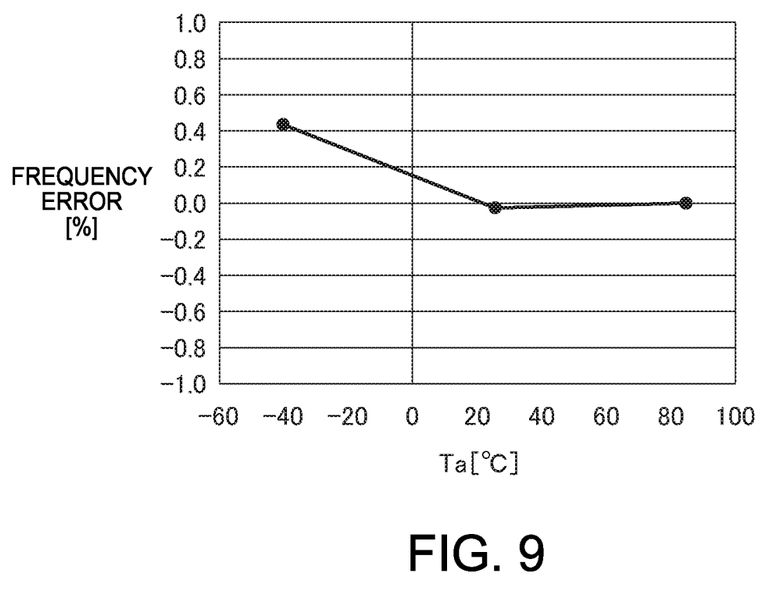
FIG. 9 is a diagram showing a frequency error in a state in which the temperature characteristic of the oscillation circuit has been corrected.

FIG. 8 is a diagram showing an example of a frequency error in a state in which the temperature characteristic of the oscillation circuit has not been corrected, and FIG. 9 is a diagram showing an example of frequency error in a state in which the temperature characteristic of the oscillation circuit has been corrected. In FIG. 8 and FIG. 9, the horizontal axis shows an environmental temperature Ta [° C.] around the oscillation circuit and the vertical axis shows a measurement value of a frequency error [%].

In a state in which the temperature characteristic of the oscillation circuit has not been corrected, the control current Icnt that is supplied to the charge-discharge type oscillation unit 60 as shown in FIG. 2 is constant regardless of the temperature. In such a case, as shown in FIG. 8, the charge-discharge type oscillation unit 60 has a temperature dependence in which the oscillating frequency decreases following the rise of the environmental temperature Ta. On the other hand, in a case where a suitable temperature dependence is given to the control current Icnt by the control current generation unit 70 shown in FIG. 2, as shown in FIG. 9, the temperature dependence of the oscillating frequency of the charge-discharge type oscillation unit 60 is suppressed by the temperature characteristic of the control current Icnt.

Also, in a state in which the temperature characteristic of the oscillation circuit is not corrected, there are cases in which the charge-discharge type oscillation unit 60 shown in FIG. 2 has a temperature dependence in which the oscillating frequency rises following with the rising of the environmental temperature Ta. In a case such as this, in the reference voltage generation circuit 71 shown in FIG. 4, an NPN bipolar transistor may be used instead of a PNP bipolar transistor. At this time, the NPN bipolar transistor is connected to the power source potential VDD side.

Also, both the PNP bipolar transistor and the NPN bipolar transistor are mounted on the reference voltage generation circuit 71, and both can be switched and used. Alternatively, in the temperature characteristic slope correction circuit 72 shown in FIG. 4, an inverting amplification circuit may be added, or, the differential amplifier circuit AMP2 may perform non-inverting amplification operation.

According to the present embodiment, it is possible to provide an oscillation circuit that continuously temperature compensates the oscillating frequency following a change in temperature to lower noise, jitter, and the like, without switching the capacitance element or resistance element that are used in an oscillation operation, by the temperature characteristic slope correction circuit 72 correcting the slope of the temperature characteristic of the reference voltage V1 and the voltage-current conversion circuit 73 converting the output voltage V2 of the temperature characteristic slope correction circuit 72 to a control current Icnt of an appropriate magnitude to control the oscillating frequency. Also, reduction of manufacturing costs and other such effects are possible because the circuit size is smaller than the existing oscillation circuit disclosed in JP-A-2012-70224.

Triple Well Structure.

Figure 10:
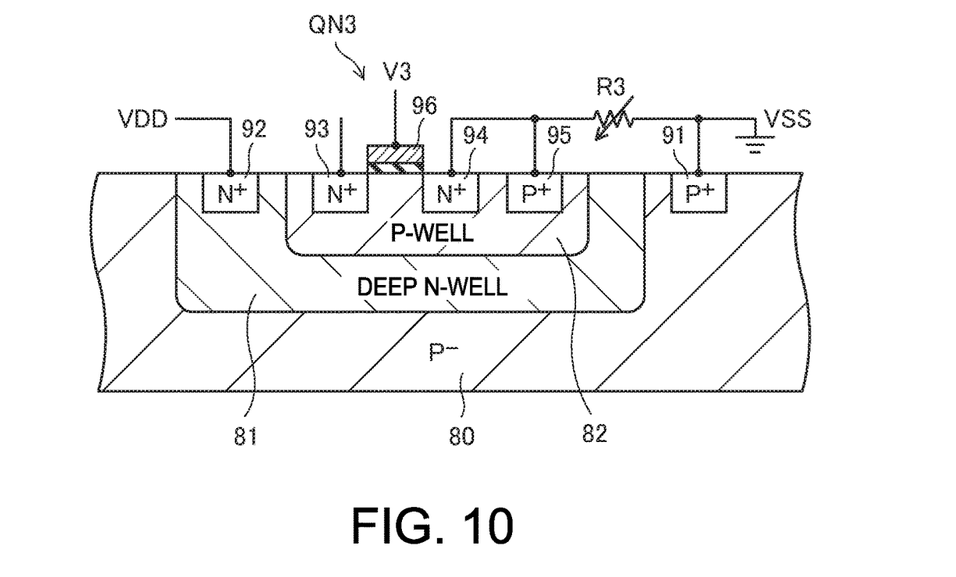
FIG. 10 is a cross sectional diagram showing a structure of a transistor QN3 shown in FIG. 4.

FIG. 10 is a schematic diagram showing the structure of the transistor QN3 shown in FIG. 4. In the present embodiment, a triple well structure is used to form the transistor QN3. As shown in FIG. 10, a deep N-well 81 and a P-type contact region 91 are provided in a P-type semiconductor substrate 80. Also, there is a P-well 82 and an N-type contact region 92 provided in the deep N-well 81. The power source potential VSS is supplied to the semiconductor substrate 80 via the P-type contact region 91, and the power source potential VDD is supplied to the deep N-well 81 via the N-type contact region 92.

Furthermore, N-type impurity regions 93 and 94, which respectively constitute the drain and source of the transistor QN3, and a P-type contact region 95 are provided in the P-well 82. The P-well 82 corresponds to the back gate of the transistor QN3. A gate electrode 96 of the transistor QN3 is arranged on the P-well 82 via gate insulation.

Accordingly, the transistor QN3 has the gate electrode 96 to which the output voltage V3 of the differential amplifier circuit AMP3 is applied, and has a back gate and a source connected to the one end of the resistor R3 that is connected at the other end to wiring of a predetermined potential (power source potential VSS in the present embodiment). In this way, by the back gate of the transistor QN3 being connected to the source, it is possible to reduce the effect of the potential of the back gate on the characteristic of the transistor QN3, and improve the accuracy of the voltage-current conversion operation.

Electronic Device

Next, an electronic device that is used with the oscillation circuit according to an embodiment of the invention will be described.

Figure 11:
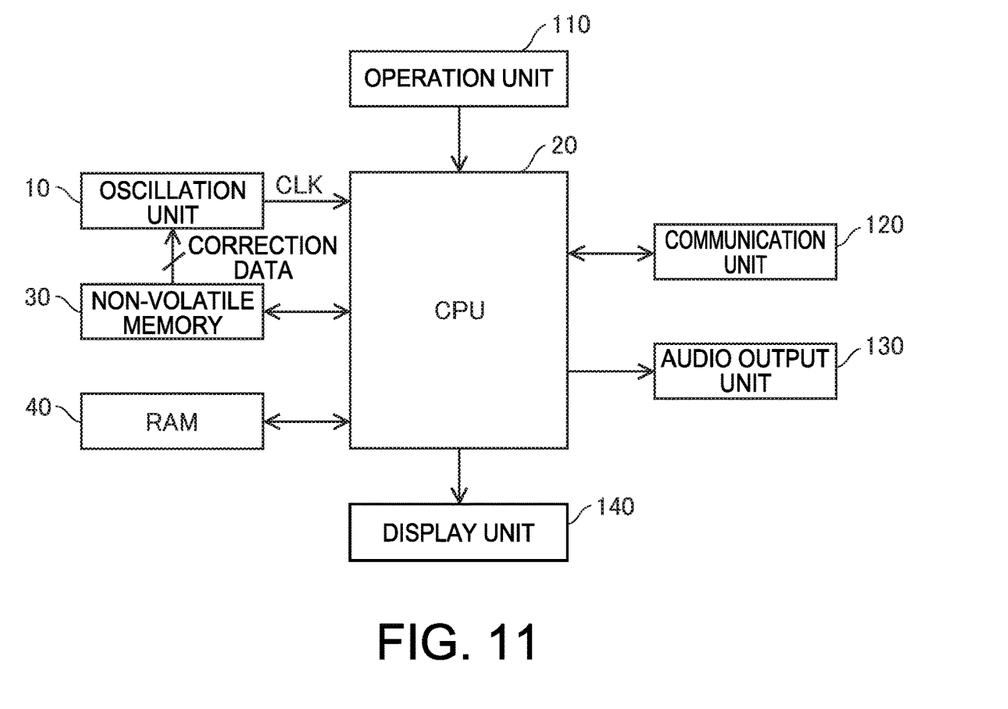
FIG. 11 is a block diagram showing an example of a configuration of an electronic device according to an embodiment of the invention.

FIG. 11 is a block diagram showing an example of a configuration of the electronic device according to an embodiment of the invention. This electronic device includes the oscillation circuit 10 according to an embodiment of the invention, a CPU 20, a non-volatile memory 30, a RAM 40, an operation unit 110, a communication unit 120, an audio output unit 130 and a display unit 140. Note that some of the constituent elements shown in FIG. 11 may be omitted or changed, and other constituent elements may be added to the constituent elements shown in FIG. 11.

The oscillation circuit 10, the CPU 20, the non-volatile memory 30 and the RAM 40 are similar to those that have been described with reference to FIG. 1. The clock signal CLK that is generated by the oscillation circuit 10 is supplied to the units of the electronic device via the CPU 20 and the like. Also, the CPU 20 controls the communication unit 120 for the purpose of performing various types of signal processing according to an operation signal supplied from the operation unit 110, data communication with an external device, and the like. Alternatively, the CPU 20 generates an audio signal for outputting various types of audio from the audio output unit 130, and generates an image signal for displaying various types of image on the display unit 140.

The operation unit 110, for example, is an input apparatus that includes an operation key, button switch, and the like, and outputs the operation signal according to an operation made by a user to the CPU 20. The communication unit 120, for example, is constituted by an analog circuit and a digital circuit, and performs data transmission between the CPU 20 and an external apparatus. The audio output unit 130, for example, includes an audio circuit, a speaker, and the like and outputs audio based on the audio signal supplied from the CPU 20. Also, the display unit 140, for example, includes a display driver circuit and an LCD (liquid crystal display apparatus) and the like, and displays various types of information based on the image signal supplied from the CPU 20.

For example, a mobile terminal such as a mobile phone, a smart card, a calculator, an electronic dictionary, an electronic game console, a digital still camera, a digital movie camera, a television, a video telephone, a security monitor, a head-mounted display, a personal computer, a printer, a network device, a car navigation apparatus, a measuring instrument, and a medical instrument (such as an electronic thermometer, a blood pressure meter, a blood glucose level meter, an electrocardiographic apparatus, an ultrasound diagnostic instrument and an electronic endoscope), and the like may qualify as the electronic device described above.

According to the present embodiment, it is possible to provide an electronic device that operates in synchronization with an accurate clock signal that is generated by the oscillation circuit 10 which continuously temperature compensates an oscillating frequency following a change in temperature to reduce noise, jitter, and the like.

The invention is not limited to the embodiment described above, and it is possible for those of ordinarily skill in the art to carry out many modifications within the technical idea of the invention.

What is claimed is:

1. An oscillation circuit, comprising:
    a charge-discharge type oscillation unit that performs an oscillation operation at an oscillating frequency that is associated with a value of a control current; and
    a control current generation unit that generates the control current,
    wherein the control current generation unit includes:
        a reference voltage generation circuit that generates a reference voltage that has a first temperature characteristic;
        a temperature characteristic slope correction circuit that corrects a slope of a temperature characteristic of the reference voltage in accordance with first correction information and generates an output voltage that has a second temperature characteristic; and
        a voltage-current conversion circuit that converts the output voltage of the temperature characteristic slope correction circuit into the control current, and that corrects the value of the control current in accordance with second correction information,
    wherein the temperature characteristic slope correction circuit includes:
        a constant voltage generation circuit that generates a constant voltage;
        a differential amplifier circuit that amplifies the reference voltage with the constant voltage as a reference; and
        a first resistor that has a resistance value that is set in accordance with the first correction information and sets an amplification factor of the differential amplifier circuit, and
    the temperature characteristic slope correction circuit corrects the slope of the temperature characteristic of the reference voltage based on the resistance value of the first resistor.

2. The oscillation circuit according to claim 1, wherein the reference voltage generation circuit includes a bipolar transistor having a base that is connected to a collector, and generates the reference voltage based on a voltage between an emitter of the bipolar transistor and the base and the collector.

3. The oscillation circuit according to claim 1,
    wherein the oscillation circuit is configured such that the reference voltage and the constant voltage become equal at a predetermined temperature.

4. The oscillation circuit according to claim 1
    wherein the voltage-current conversion circuit includes:
    a first transistor and a second transistor that constitute a current mirror circuit;
    a third transistor that supplies current to the first transistor in accordance with the output voltage of the temperature characteristic slope correction circuit; and
    a second resistor that has a resistance value set in accordance with the second correction information, and sets a voltage-current conversion rate of the third transistor, and
    the voltage-current conversion circuit corrects the value of the control current that is output from the second transistor based on the resistance value of the second resistor.

5. The oscillation circuit according to claim 4, wherein the third transistor is formed with use of a triple well structure, and has a source and a back gate that are connected to an end of the second resistor that has another end that is connected to wiring of a predetermined potential.

6. A microcomputer comprising:
    the oscillation circuit according to claim 1; and
    a storage unit that stores the first and second correction information and supplies the first and second correction information to the oscillation circuit.

7. A microcomputer comprising:
    the oscillation circuit according to claim 2; and
    a storage unit that stores the first and second correction information and supplies the first and second correction information to the oscillation circuit.

8. A microcomputer comprising:
    the oscillation circuit according to claim 3; and
    a storage unit that stores the first and second correction information and supplies the first and second correction information to the oscillation circuit.

9. A microcomputer comprising:
    the oscillation circuit according to claim 4; and
    a storage unit that stores the first and second correction information and supplies the first and second correction information to the oscillation circuit.

10. A microcomputer comprising:
    the oscillation circuit according to claim 5; and
    a storage unit that stores the first and second correction information and supplies the first and second correction information to the oscillation circuit.

11. The microcomputer according to claim 6,
    wherein the storage unit includes a non-volatile memory or a plurality of fuses.

12. An electronic device comprising the oscillation circuit according to claim 1.

13. An electronic device comprising the oscillation circuit according to claim 2.

14. An electronic device comprising the oscillation circuit according to claim 3.

15. An electronic device comprising the oscillation circuit according to claim 4.

16. An electronic device comprising the oscillation circuit according to claim 5.

* * * * *